(12) United States Patent
Plesski et al.

(10) Patent No.: US 11,716,070 B2
(45) Date of Patent: *Aug. 1, 2023

(54) FILM BULK ACOUSTIC SENSORS USING THIN LN-LT LAYER

(71) Applicant: Murata Manufacturing Co., Ltd, Nagaokakyo (JP)

(72) Inventors: Viktor Plesski, Gorgier (CH); Dejan Nenov, Boise, ID (US); Ventsislav Yantchev, Sofia (BG); Robert Hammond, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/724,388

(22) Filed: Apr. 19, 2022

(65) Prior Publication Data

US 2022/0239279 A1    Jul. 28, 2022

Related U.S. Application Data

(63) Continuation of application No. 17/319,082, filed on May 12, 2021, now Pat. No. 11,329,625, which is a (Continued)

(51) Int. Cl.
*H03H 9/205* (2006.01)
*H03H 9/56* (2006.01)
(Continued)

(52) U.S. Cl.
CPC .......... *H03H 9/205* (2013.01); *H03H 9/0211* (2013.01); *H03H 9/02015* (2013.01); *H03H 9/131* (2013.01); *H03H 9/564* (2013.01)

(58) Field of Classification Search
CPC .. H03H 9/0131; H03H 9/205; H03H 9/02015; H03H 9/0211; H03H 9/5694
See application file for complete search history.

(56) References Cited

U.S. PATENT DOCUMENTS

| 5,705,399 A | 1/1998 | Larue |
| 5,853,601 A | 12/1998 | Krishaswamy et al. |

(Continued)

FOREIGN PATENT DOCUMENTS

| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jeffrey M Shin
(74) *Attorney, Agent, or Firm* — ArentFox Schiff LLP (57) ABSTRACT

Acoustic sensor devices and sensor systems are disclosed. An acoustic sensor device includes a piezoelectric plate having a front surface and a back surface. A floating back-side conductor pattern is formed on the back surface. A first and second front-side conductor patterns are formed on a portion of the front surface opposite the back-side conductor pattern. A sensing layer is formed over all or a portion of the floating back-side conductor pattern.

20 Claims, 6 Drawing Sheets

Related U.S. Application Data continuation-in-part of application No. 17/125,779, filed on Dec. 17, 2020, now Pat. No. 11,251,775, which is a continuation of application No. 17/090,599, filed on Nov. 5, 2020, now Pat. No. 10,944,380, which is a continuation of application No. 16/932,719, filed on Jul. 18, 2020, now Pat. No. 10,862,454.

(60) Provisional application No. 62/958,851, filed on Jan. 9, 2020, provisional application No. 62/875,855, filed on Jul. 18, 2019.

(51) Int. Cl.
*H03H 9/02* (2006.01)
*H03H 9/13* (2006.01)

(56) References Cited

U.S. PATENT DOCUMENTS

| | | | |
|---|---|---|---|
| 6,540,827 B1 | 4/2003 | Levy et al. | |
| 6,707,229 B1 | 3/2004 | Martin | |
| 7,463,118 B2 | 12/2008 | Jacobsen | |
| 7,535,152 B2 | 5/2009 | Ogarni et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 10,862,454 B1 | 12/2020 | Plesski et al. | |
| 10,944,380 B1 | 3/2021 | Plesski et al. | |
| 11,329,625 B2 * | 5/2022 | Plesski | H03H 9/205 |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0131953 A1 | 5/2019 | Gong | |
| 2019/0273480 A1 | 9/2019 | Lin | |
| 2021/0119604 A1 | 4/2021 | Plesski et al. | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM OF 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

(56) References Cited

OTHER PUBLICATIONS

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

FILM BULK ACOUSTIC SENSORS USING THIN LN-LT LAYER

RELATED APPLICATION INFORMATION

This patent is a continuation of patent application Ser. No. 17/319,082, entitled FILM BULK ACOUSTIC SENSORS USING THIN LN-LT LAYER, filed May 12, 2021, which is a continuation-in-part of patent application Ser. No. 17/125,779, entitled FILM BULK ACOUSTIC RESONATORS IN THIN LN-LT LAYERS, filed Dec. 17, 2020, now U.S. Pat. No. 11,251,775, which is a continuation of patent application Ser. No. 17/090,599, entitled FILM BULK ACOUSTIC RESONATORS IN THIN LN-LT LAYERS, filed Nov. 5, 2020, now U.S. Pat. No. 10,944,380, which is a continuation of patent application Ser. No. 16/932,719, entitled FILM BULK ACOUSTIC RESONATORS IN THIN LN-LT LAYERS, filed Jul. 18, 2020, now U.S. Pat. No. 10,862,454, which claims priority from provisional patent application No. 62/875,855, entitled FILM ACOUSTIC RESONATORS IN THIN LN-LT LAYERS, filed Jul. 18, 2019, and provisional application No. 62/958,851, entitled YBAR ON ROTATED Y-CUTS OF LN, filed Jan. 9, 2020. The entire contents of each application are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to sensors using film bulk acoustic resonators.

Description of the Related Art

A variety of acoustic wave resonators have been developed, primarily for use in radio frequency filters for communications equipment. One type of acoustic wave resonator is the Y-cut film bulk acoustic resonator (YBAR) described in U.S. Pat. Nos. 10,944,380 and 10,862,454.

In addition to applications in RF filters, acoustic bulk and surface wave resonators are widely used as sensors to detect the presence of various gases, liquids, and biological or chemical species. To function as a sensor, an acoustic wave resonator may be coated with a sensing material capable of absorbing, adsorbing, or otherwise capturing the material or species to be detected. The presence of the captured species causes a measurable shift in the resonance frequency of the acoustic wave resonator.

A well-known acoustic wave sensor is the quartz microbalance (QMB). A QMB is a shear bulk wave fundamental mode quartz resonator operating in 4-6 MHz frequency range. The resonance frequency is changed when a layer of molecules is deposited on its surface. The precise measurement of the frequency change allows a QMB to measure mass density changes of the order of 1 $\mu g/cm^2$, or one molecular layer. The advantage of a QMB sensor is that it directly measures absolute surface density of attached molecular layer, independent on the other physical properties (optical, magnetic, chemical, phase state, etc.) of the layer.

The sensitivity of an acoustic wave sensor increases with its frequency. To allow operation at higher frequencies, film bulk acoustic resonators (FBARs) and different types of surface waves and Lamb modes in piezoelectric membranes have been proposed for use in sensors. However, most FBARs currently exploit extension mode vibrations and are not usable for liquid sensing because the liquid load introduces unacceptable high acoustic losses. Another problem is that FBAR sensors require electric contacts to electrodes on both sides of the piezoelectric membrane. Lamb wave sensors exploiting S0 mode also suffer from increased loss when submerged in liquid or having liquid deposited on one side.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
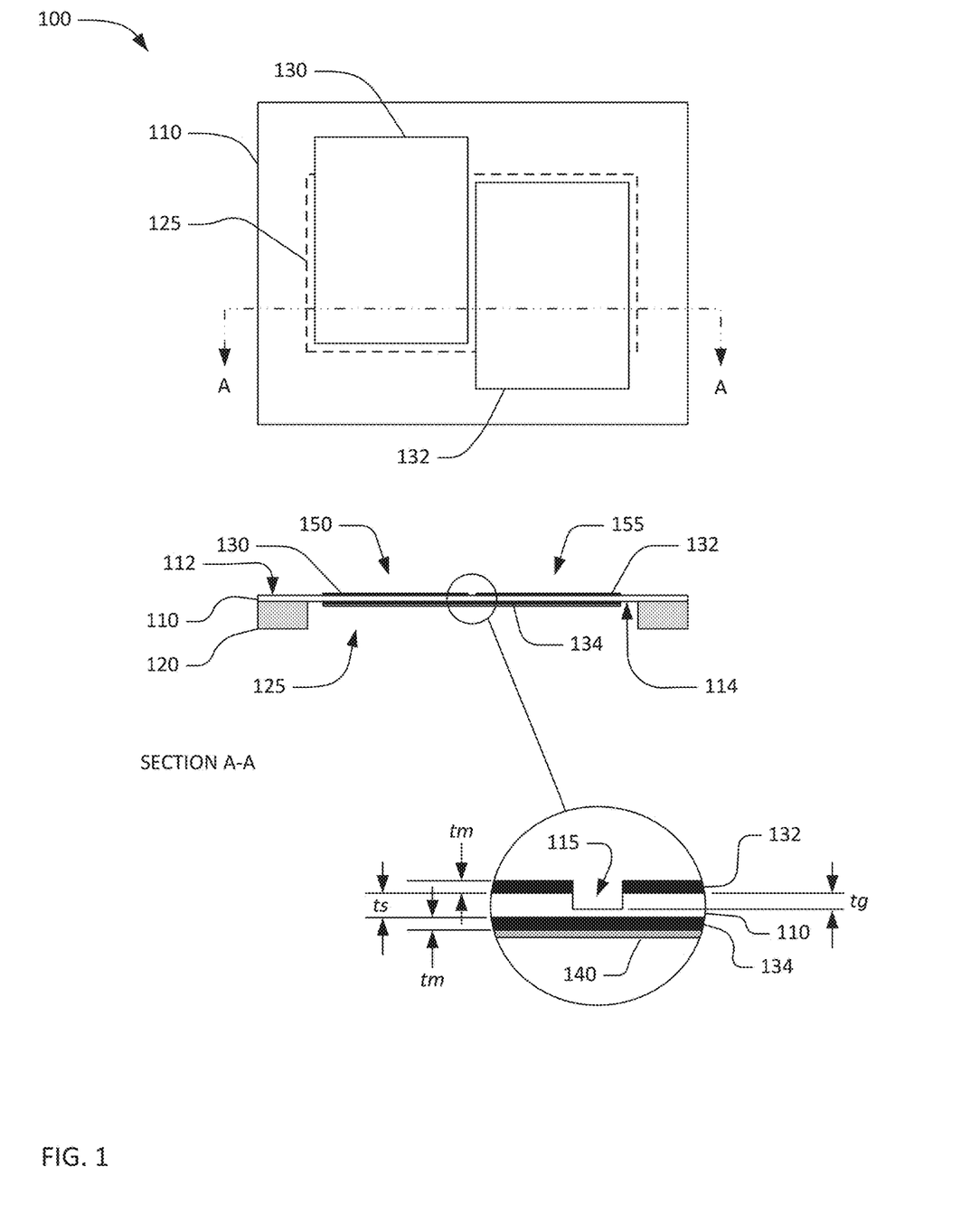
FIG. 1 includes a schematic plan view and schematic cross-sectional views of a sensor using a Y-cut film bulk acoustic resonator (YBAR).

FIG. 1 shows a simplified top view and a cross-sectional view of one period of a sensor 100 based on a Y-cut film bulk acoustic resonator (YBAR). The YBAR is made up of a piezoelectric plate 110 having essentially parallel front and back surfaces 112, 114, respectively. In this context, "essentially parallel" means "parallel within reasonable manufacturing tolerances." The piezoelectric plate 110 is a thin single-crystal layer of a piezoelectric material. The piezoelectric plate is preferably lithium niobate (LN) but may be lithium tantalate (LT), lanthanum gallium silicate, gallium nitride, or some other material. The piezoelectric plate is cut such that the orientation of the X, Y, and Z crystalline axes with respect to the front and back surfaces is known and consistent.

The thickness is of the piezoelectric plate 110 may be determined from $$ts \approx n * V_{SH} / 2F_R,$$

where $F_R$ is a desired operation frequency, $V_{SH}$ is the shear wave velocity of the piezoelectric plate, and n=1, 3, 5, . . . is the desired mode (overtone) number. n=1 is usually referred to as "fundamental mode" and n>1 as "overtones". More exact formulas relating the membrane thickness and including thickness of electrodes are known and can be used in design of the sensor.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

A cavity 125 is formed in the substrate 120 such that the portion of the piezoelectric plate 110 containing the front-side and back-side conductor patterns 130, 132, 134 is suspended over the cavity 125. "Cavity" has its conventional meaning of "an empty space within a solid body." The portion of the piezoelectric plate (including the conductor patterns and a sensing layer 140 (described subsequently) suspended over the cavity is referred to herein as the "diaphragm" due to its resemblance to the diaphragm of a microphone. The cavity 125 may be a hole completely through the substrate 120 (as shown in Section A-A) or a recess in the substrate 120 that does not extend through the substrate 120. The cavity 125 may be formed, for example, by selective etching of the substrate 120 before or after the piezoelectric plate 110 and the substrate 120 are attached. As shown in FIG. 1, the cavity 125 has a rectangular shape. A cavity of a YBAR may have a different shape, such as a regular or irregular polygon. The cavity of a YBAR may more or fewer than four sides, which may be straight or curved.

A first front-side conductor pattern 130 and a second front-side conductor pattern 132 are formed on the front surface 112 of the piezoelectric plate 110. A back-side conductor pattern 134 is formed on the second surface 114 of the piezoelectric plate 110. The back-side conductor pattern 134 is a "floating" conductor pattern, meaning that is not electrically connected to any other conductor. The back-side conductor pattern is capacitively coupled to the first and second front-side conductor patterns. The conductor patterns may be molybdenum, aluminum, copper, gold, or some other conductive metal or alloy. The back-side conductor pattern and the front side conductor patterns are not necessarily the same material. The portion of the piezoelectric plate 110 between the first front-side conductor pattern 130 and the back-side conductor pattern 134 forms a first resonator 150. The portion of the piezoelectric plate 110 between the second front-side conductor pattern 132 and the back-side conductor pattern 134 forms a second resonator 155. The first and second resonators 150, 155 are electrically in series such that an RF signal applied between the first and second front-side conductor patterns 130, 132 excites acoustic waves in both the first and second resonators 150, 155.

The diaphragm forms a seal over the cavity 125 such that the first and second front-side conductor patterns 130, 134 are not exposed to the environment adjacent to the back-side conductor pattern 134.

Ideally, when an RF signal is applied between the first and second front-side conductor patterns 130, 132, the back-side conductor pattern should remain at ground potential. To this end, a capacitance of the first resonator 150 should be equal to a capacitance of the second resonator 155. Assuming the piezoelectric diaphragm has uniform thickness, the capacitances will be equal if the area of the first resonator 150, which is to say the area of overlap between the first front-side conductor pattern 130 and the back-side conductor pattern 134, is equal to the area of the second resonator 155. The back-side conductor pattern 134 will remain at ground potential when balanced signals (i.e. signals with equal amplitude and 180-degree phase difference), are applied to the first and second conductor patterns 130, 132.

The piezoelectric plate may be Y-cut (i.e. with the Y crystalline axis of the piezoelectric material normal to the surfaces 112, 114) or rotated Y-cut (i.e. with the Y crystalline axis of the piezoelectric material rotated by a predetermined angle with respect to normal to the surfaces 112, 114). In this case, an RF signal applied between the first and second front-side conductor patterns 130, 132 will excite shear acoustic waves in both the first and second resonators. Rotated Y-cuts can be used to achieve shear displacements exclusively in planes parallel to the surface 112, 114. Selection of the rotation angle can be used to control the electromechanical coupling of the resonators. Shear displacements parallel to the surfaces of the piezoelectric plate do not generate compressional waves in an adjacent liquid thus allowing high Q-factor operation of the resonator. The sensing (bottom) metallized surface is uniform and continuous, containing no connectors, wires, grooves or other structures, which is convenient for deposition of sensing layer 140. The maximal amplitude of vibration on the surface guaranties high sensitivity of the sensor.

As shown in FIG. 1, the first and second front-side conductor patterns and the back-side conductor pattern 134 are rectangular in shape. The conductor patterns may be non-rectangular (e.g. trapezoidal, curved, or irregular) to suppress parasitic acoustic modes.

In the detailed cross-sectional view, the thickness of the piezoelectric plate 110 is dimension ts and the thickness of the conductor patterns 130, 132, 134 is dimension tm. The thickness ts of the piezoelectric plate may be, for example, 100 nm to 1000 nm. The thickness tm of the conductor patterns 130, 132, 134 may be, for example, 10 nm to 500 nm. The thickness of the conductor patterns may be the same or the first and second front-side conductor patterns and the back-side conductor pattern may have different thicknesses.

The piezoelectric plate 110 may be etched or otherwise removed, completely or only partially, in the area between the first and second front-side conductor patterns 130, 132, forming slots 115. The presence of the slots 115 may suppress lateral acoustic modes that might be excited by the electric field between the front-side conductor patterns 130, 132. A depth tg of the slot 115 can extend partially or completely through the piezoelectric plate 110.

To convert a YBAR into the sensor 100, a sensing layer 140 is disposed on the back-side conductor pattern 134. The sensing layer 140 may be, for example, a film, a monolayer, or a surface treatment. The sensing layer 140 may be disposed directly on the back-side conductor pattern 134 or may be coupled to the back-side conductor pattern 134 via an intermediate layer such as an adhesion promoter.

The sensing layer 140 is configured to selectively capture a target species from a gaseous or liquid environment. The target species may by biological or chemical. The target species may be captured by absorption into the sensing layer and/or adsorption onto the surface of the sensing layer. A variety of materials may be used for the sensing layer 140 as appropriate for the target species. For example, the sensing layer 140 may be an antigen, an antibody, an enzyme, a nucleic acid, a DNA molecule, a polymer or other organic material with a particular functional group, an inorganic layer, or some other material.

When used as a sensor, the sensing layer 140 is exposed to a gaseous or liquid sample medium that may, or may not, contain the target species to be detected. When the target species is present, it is captured in or on the sensing layer, which incrementally increases the mass of the diaphragm. Increasing the mass of the diaphragm reduces the resonance frequency of the first and second resonators. The change in resonance frequency can be measured by a suitable measurement system, thus detecting the presence of the target species.

The structure of the YBAR 100 is well suited for use as a sensor. Importantly, the back-side electrode is continuous and there is no electric field extending from the back-side electrode into the sample medium. Since there is no electric field in the sample medium, the sample medium can be conductive. Further, the dielectric permittivity of the sample medium does not influence the resonance frequency of the YBAR. The continuous back-side electrode allows uninterrupted flow of a liquid or gaseous sample medium.

The primary acoustic mode of the YBAR is a shear mode in which atomic displacements are parallel to the surfaces of the piezoelectric plate. Very little or no shear acoustic energy is transferred to the sample medium.

The back-side electrode can be made of any appropriate electrically conductive material. For example, the back-side electrode may be gold to avoid corrosion.

A YBAR sensor can work at 2-5 GHz frequency range, providing high sensitivity. For a YBAR using a 400 nm lithium niobate piezoelectric plate, a single molecular layer of a target species attached to the sensing layer shift the resonance frequency of the YBAR by roughly 5 MHz to 10 MHz. For another example of the sensitivity of a YBAR sensor, imagine that only one virus of 100 nm in diameter is captured by each resonator having 10×50=500 µm² area. In this case the relative frequency shift is of the order of 1 ppm, or absolute shift is around 5 kHz, which can be easily measured.

The operation of a YBAR sensor on the 3$^{rd}$ or 5$^{th}$ harmonic (overtone) is also possible. Operation at an overtone will allow the use of a 3-times or 5-times thicker piezoelectric plate for a given frequency of operation. A thicker piezoelectric plate will make a sensor more robust mechanically.

When a YBAR sensor is in contact with a liquid, the resonance frequency will shift due to the viscosity of the liquid. The frequency shift Δf due to viscosity can be estimated by the following formula:

$$\frac{\Delta f}{f_R} \cong -\frac{(1-j)\sqrt{\omega \rho \eta / 2n}}{\pi \cdot \rho_p \cdot V_{SH}},$$

where $f_R$ is the resonance frequency in air, p is the liquid density, η is the viscosity of the liquid, and n=1, 3, 5 is the mode number. The viscosity effect always moves frequency down. For water, the relative shift will be of the order 0.003, or 15 MHz for a 5 GHz resonator. The attenuation due to the viscosity of water will reduce the Q-factor of the YBAR by roughly 1.5-2 times. Since the expected unloaded Q-factor of a YBAR using the fundamental mode is in the range 300-600. The resonance will remain well pronounced when the YBAR sensor is exposed to water.

Figure 2:
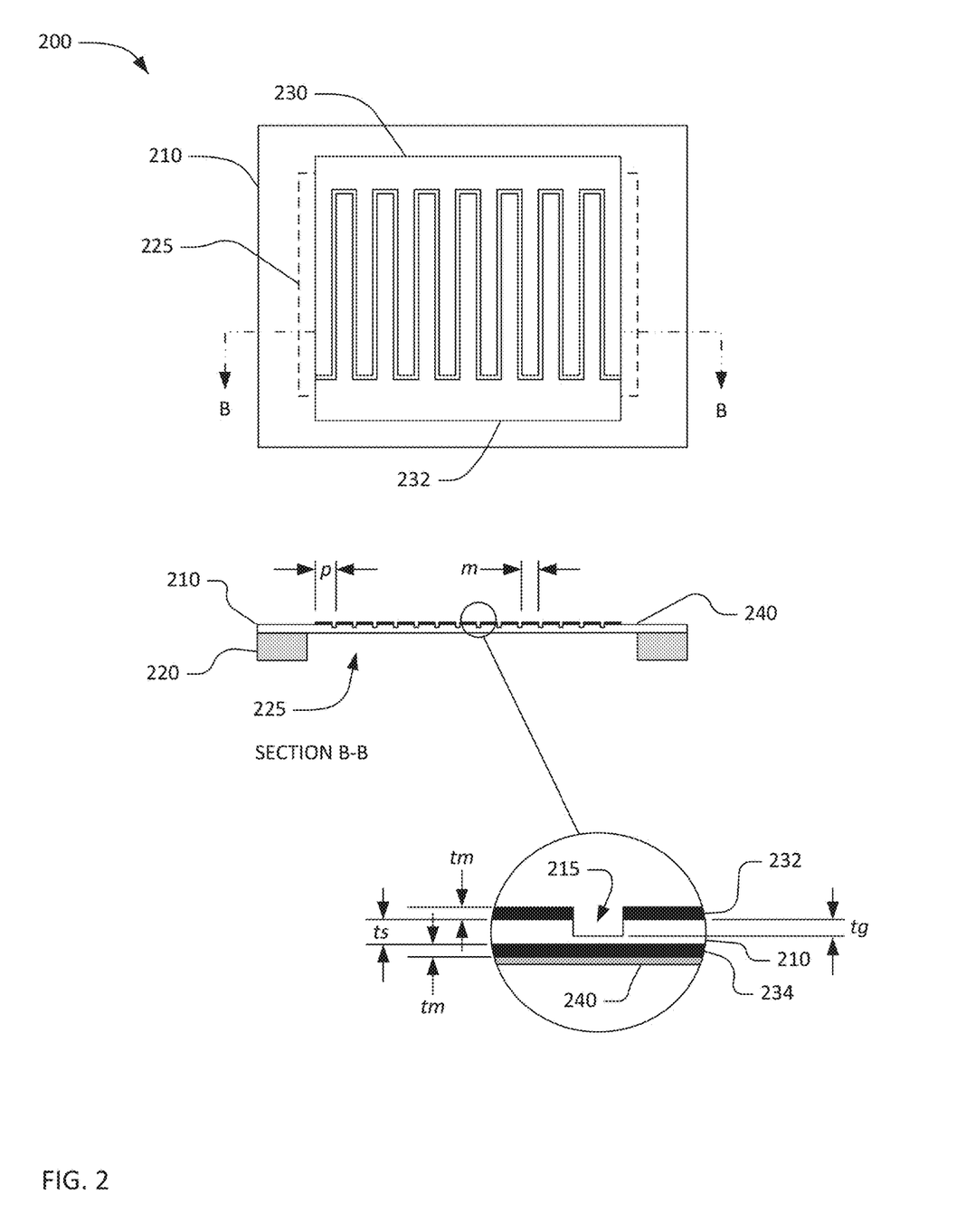
FIG. 2 includes a schematic plan view and schematic cross-sectional views of another sensor using a YBAR.

FIG. 2 shows a simplified top view and a cross-sectional view of another YBAR 200. The YBAR 200 is made up of a piezoelectric plate 210 attached to a substrate 220 as previously described. A cavity 225 is formed in the substrate 220 such that a portion of the piezoelectric plate 210 is suspended over the cavity 225.

First and second front-side conductor patterns 230, 232 are formed on the front side of the piezoelectric plate (the side facing away from the cavity 225). The first and second front-side conductor patterns 230, 232 form an interleaved finger pattern (IFP) similar to an interdigital transducer or IDT used in surface acoustic wave resonators. The first front-side conductor pattern 230 includes a first plurality of parallel fingers extending from a first busbar. The second front-side conductor pattern 232 includes a second plurality of parallel fingers extending from a second busbar. The first and second pluralities of parallel fingers are interleaved and most or all of the interleaved parallel fingers are disposed on the portion of the piezoelectric plate 210 suspended over the cavity 225. The width m of each finger will be a substantial portion of the pitch p, or center-to-center spacing, of the fingers.

As shown in the detail view, slots 215 may be formed in the piezoelectric plate 210 between the interleaved fingers of the first and second front-side conductor patterns 230, 232. The presence of the slots 215 may suppress lateral acoustic modes that might be excited by the electric field between the front-side conductor patterns 230, 232. A depth tg of the slots 215 can extend partially or completely through the piezoelectric plate 210. The grooves also prevent spreading of vibration energy along the structure thus improving Q-factor of resonators.

A back-side conductor pattern 240 is formed on the back side of the piezoelectric plate 210 opposed to the first and second front-side conductor patterns 230, 232. A sensing layer 240 is formed on the back-side conductor pattern 234. A first resonator is formed between the first front-side conductor pattern 230 and the backside conductor pattern 234. A second resonator is formed between the second front-side conductor pattern 232 and the back-side conductor pattern 234. The first and second front-side conductor patterns may have the same number of interleaved fingers.

Figure 3:
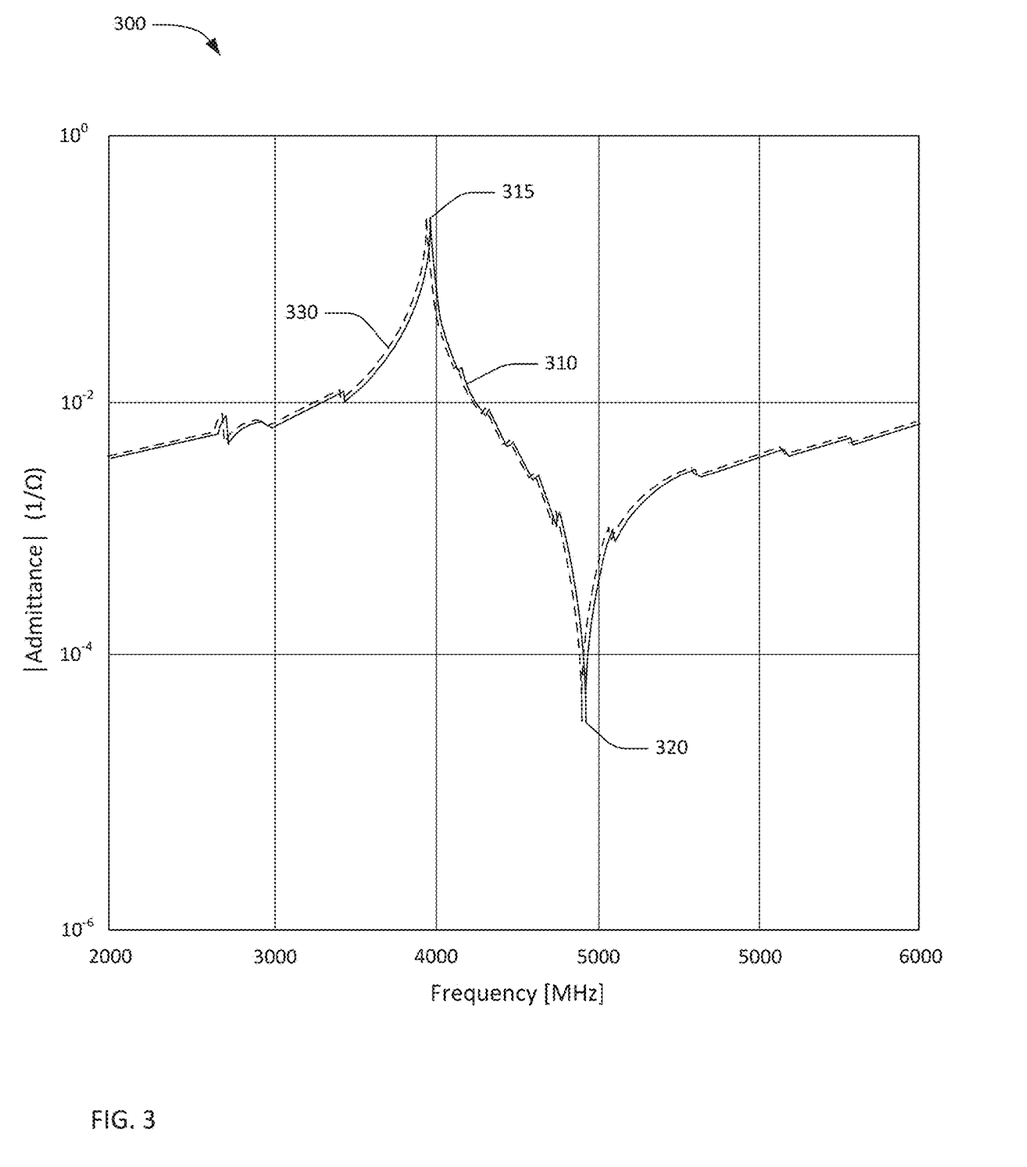
FIG. 3 is a chart of admittance as function of frequency of an exemplary YBAR.

FIG. 3 is a graph 300 of the performance of an exemplary YBAR suitable for use in a sensor. FIG. 3 is based on simulation of the YBAR using a finite element method. The exemplary YBAR includes a rotated Y-cut lithium niobate piezoelectric plate with Euler angles (0°, 81.5°, 0°). These Euler angles maximize the electromechanical coupling for the primary shear acoustic mode. The piezoelectric plate thickness in this example is 400 nm thick. The first and second front-side conductor patterns are interleaved fingers with a width w of 8µ and a pitch p of 10µ. Slots are provided in the piezoelectric plate between fingers to prevent excitation of horizontally propagating spurious waves. The back-side conductor pattern is floating. Both the front-side and back-side conductor patterns are aluminum 50 nm thick.

The solid curve 310 is a plot of the absolute value of the admittance of the exemplary YBAR as a function of frequency. The exemplary YBAR has a resonance 215, where its admittance is maximum, at a resonance frequency of 3938 MHz. The exemplary YBAR has an anti-resonance 320, where its admittance is minimum, at an anti-resonance frequency of 4929 MHz. The Q factor of the exemplary YBAR is 560 at the resonance frequency and 600 at the anti-resonance frequency. The dashed curve 330 represents an approximate frequency shift caused by absorption or adsorption of a monolayer of a subject species by the sensing layer of a YBAW sensor.

Figure 4:
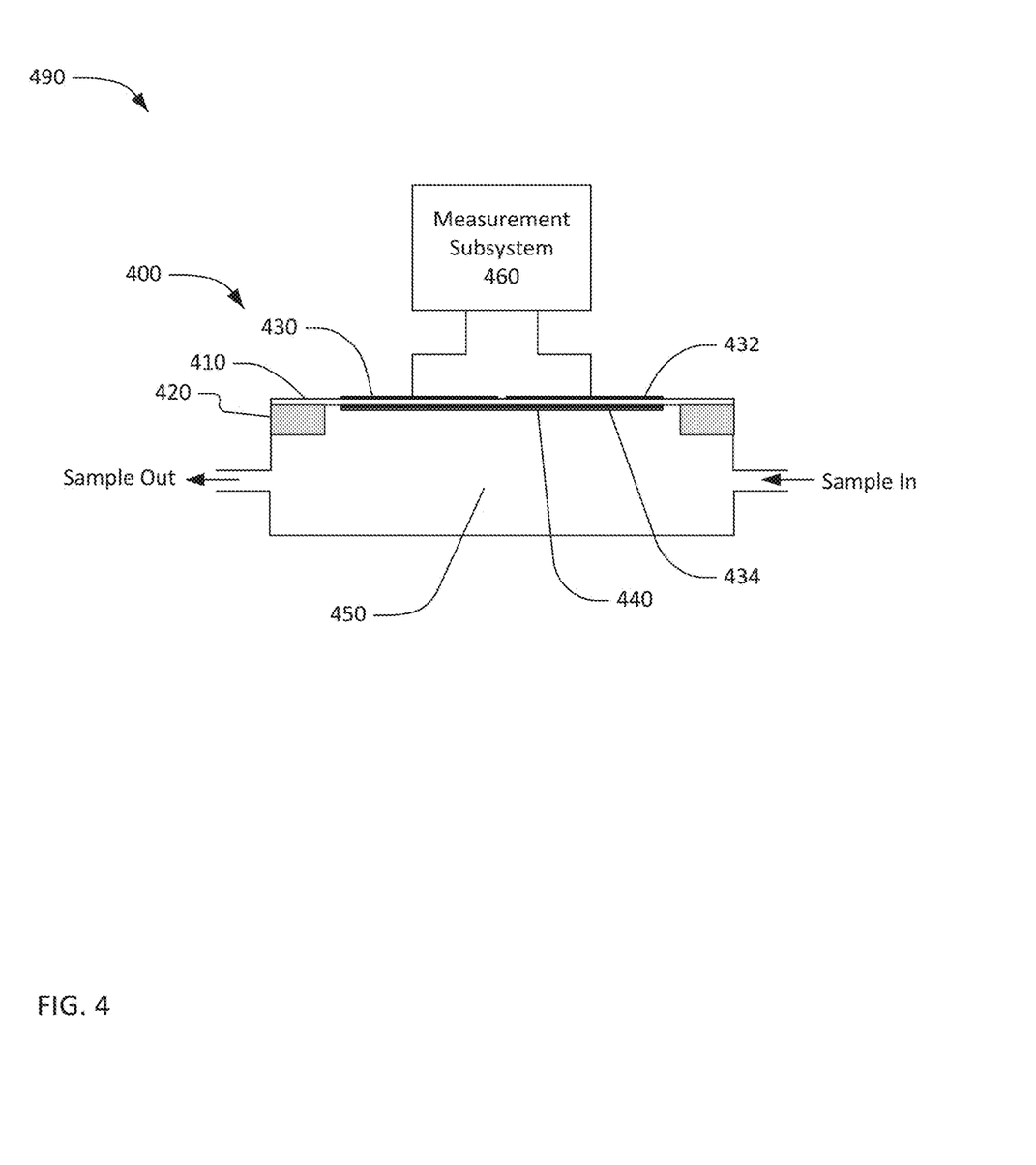
FIG. 4 is a block diagram of a sensing system using a YBAR sensor.

FIG. 4 is a schematic block diagram of a sensor system 490 incorporating a YBAR sensor 400. The YBAR sensor 400 includes a piezoelectric plate 410, a substrate 420 with a cavity, first and second front-side conductor patterns 430, 432, a floating back-side conductor pattern 434, and a sensing layer 440. In addition to a YBAR sensor, a sensor system must include a means for exposing the YBAR sensor to an environment in which the target species is to be detected (an environment that may or may not contain the target species) and a measurement subsystem 460 to determine if the resonance frequency of the YBAR sensor has, or has not, been affect by the presence of the target species.

Ideally, the measurement subsystem 460 applies a balanced RF signal to the conductor patterns 430, 432, which is to say the RF signals applied to the two conductor patterns are of opposite polarity, or 180 degrees out-of-phase, and equal in amplitude. Further, the capacitance between each of the conductor patterns 430, 430 and the back-side conductor pattern 434 are substantially equal. In this case, there is minimal or zero potential on the backside conductor pattern 440. Having minimal or zero potential on the backside conductor pattern 440 minimizes the influence of the electrical characteristics (e.g. dielectric permittivity and/or conductance) of the environment in which the target species is to be detected.

In the sensor system 490 of FIG. 4, the means for exposing the YBAR sensor 400 to an environment is depicted schematically as a rectangular chamber 450 with "sample in" and "sample out" ports. Depending on the environment and the target species, the means for exposing the YBAR sensor to the environment span a wide range of possibilities. The means may be as simple as exposing a YBAR sensor to a natural environment such as the ambient air or a flowing or stagnant body of water. At a slightly higher level of complexity, a YBAR sensor may be mounted, permanently or temporarily, in a pipe, duct, or other conduit through which the liquid or gaseous environment flows during a manufacturing or distribution process. In this context, "conduit" has the broadest meaning of "a natural or artificial channel though which something, such as a fluid, is conveyed". Similarly, a YBAR sensor may be mounted, permanently or temporarily, in a tank or other container in which the liquid or gaseous environment is stored. The means for exposing the YBAR sensor to an environment may include a dedicated tube or conduit and, optionally, a pump, to direct all or a portion of an environment to the YBAR sensor. For example, a sample of a bodily fluid (the environment) may be automatically divided into a plurality of portions routed by conduits to respective sensors including one or more YBAR sensors.

The measurement subsystem 460 is configured to measure the resonance frequency of the YBAR sensor 400 and thereby determine the presence or absence, and optionally the amount, of a target species in the environment presented to the YBAR sensor. As previous described, the resonance frequency of the YBAR sensor 400 will typically be 1 GHz to 5 GHz and the anticipated frequency change due to capture of the target species may be about 0.1% of the resonance frequency.

A variety of known techniques may be used in the measurement subsystem 460 to measure the resonance frequency of the YBAR sensor 400. For example, the measurement subsystem 460 may be a network analyzer that measures the admittance of the YBAR sensor over a predetermined frequency range. In this case the resonance frequency of the YBAR sensor is the frequency where the admittance is greatest. For a second example, the measurement system 460 may incorporate the YBAR sensor into an oscillator circuit. The frequency of the oscillation may be determined using a frequency counter.

The measurement subsystem may contain additional sensors not shown in FIG. 4. For example, since the resonance frequency of a YBAR sensor may be dependent on temperature, the measurement subsystem 460 may include a temperature sensor and a temperature compensation circuit or processor.

Figure 5:
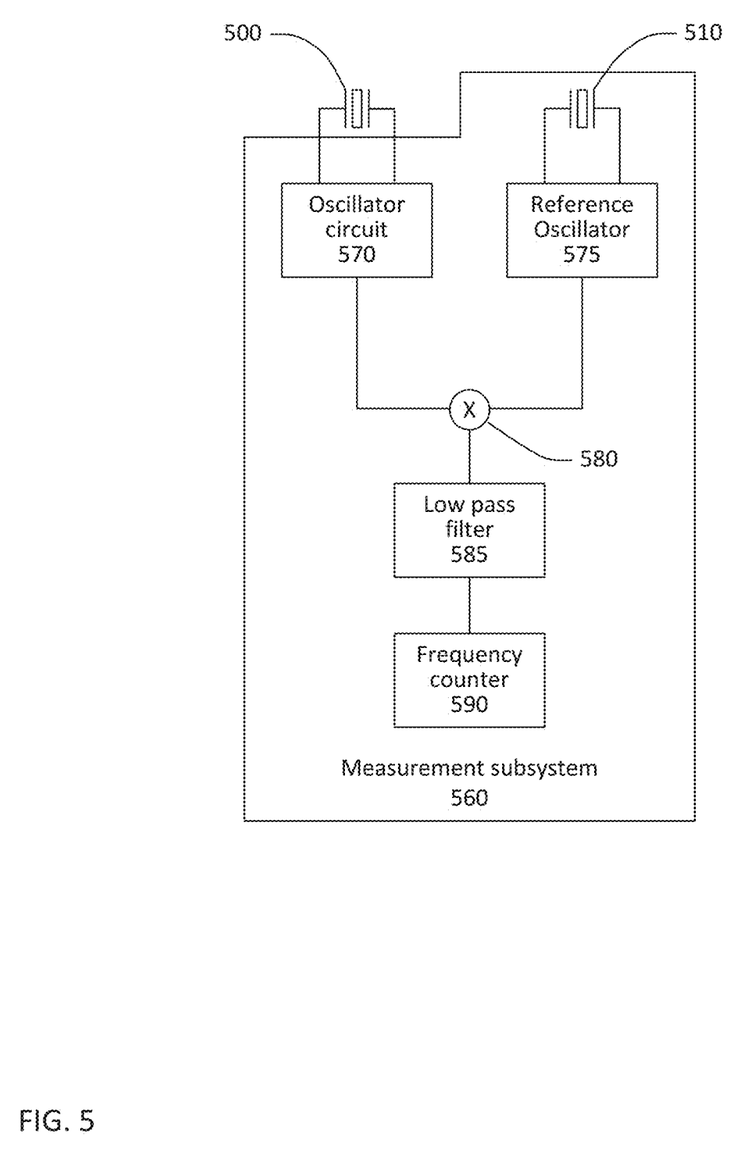
FIG. 5 is another block diagram of a sensing system using a YBAR sensor.

FIG. 5 is a schematic block diagram of another exemplary measurement subsystem 560 to measure the resonance frequency of a YBAR sensor 500. The measurement subsystem 560 includes an oscillator circuit 570 coupled to the YBAR sensor 500 and configured to output a signal having a frequency equal to the resonance frequency of the YBAR sensor. The measurement subsystem 560 also includes a reference oscillator 575 configured to output a signal having a frequency equal to the resonance frequency of a reference YBAR 510. The reference YBAR 510 and the YBAR sensor 500 may be, to the extent possible, identical. The reference YBAR 510 and the YBAR sensor 500 may be exposed to the environment in which the target species is to be detected. For example, the YBAR sensor 500 and the reference YBAR 510 may be concurrently fabricated on the same piezoelectric plate and substrate. The YBAR sensor 500 and the reference YBAR 510 may be identical except that the reference YBAR 510 does not include a sensing layer. Both the YBAR sensor 500 and the reference YBAR 510 may be exposed to the same environment and, importantly, may be at the same temperature.

The signals output from the oscillator circuit 570 and the reference oscillator 575 are multiplied by a mixer 580 and input to a low pass filter 585. The output from the lowpass filter 585 is a signal with a frequency equal to the difference between the frequencies of the signals output from the oscillator circuit 570 and the reference oscillator 575. The frequency of the signal output from the lowpass filter 585 may then be determined, for example, by a frequency counter 590.

Description of Methods

Figure 6:
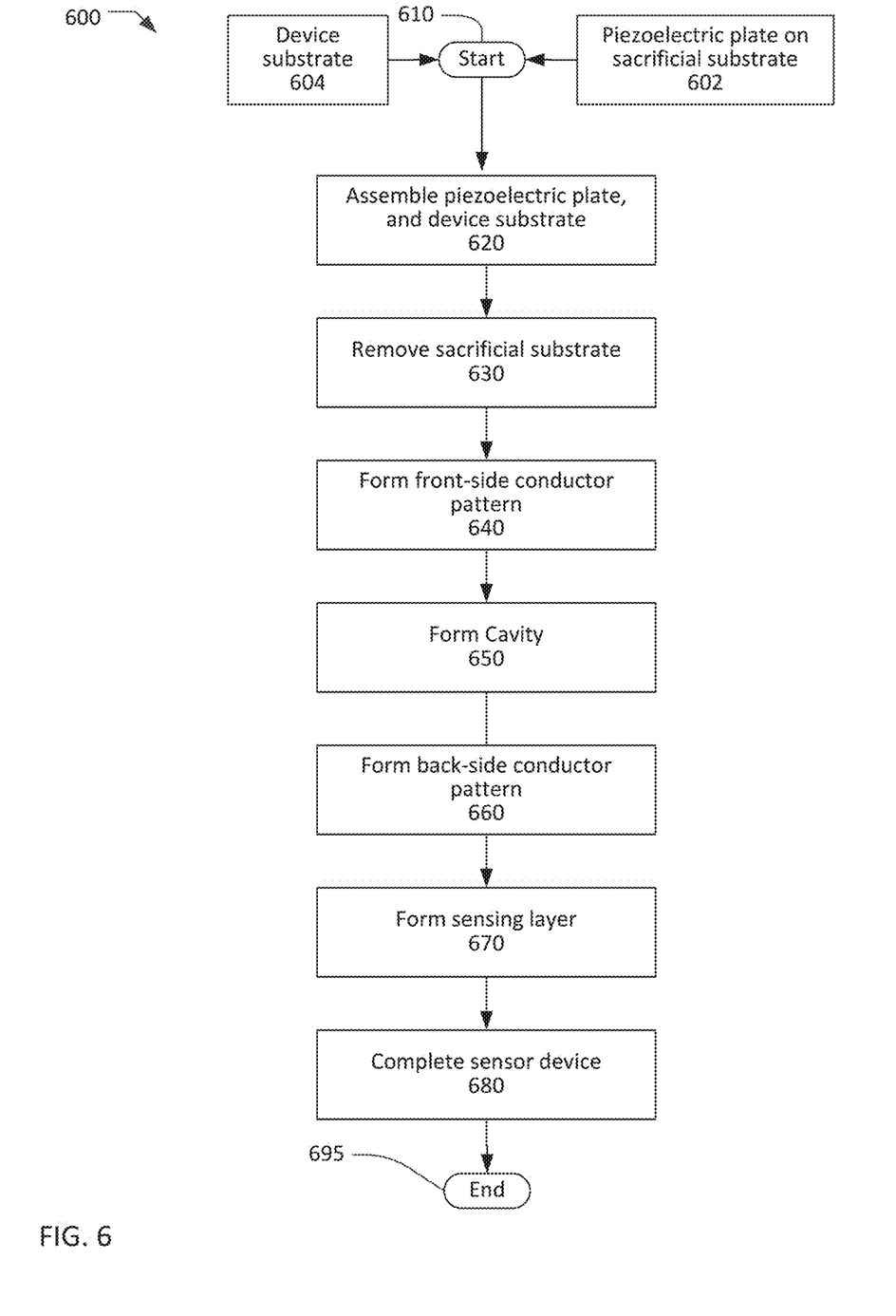
FIG. 6 is a flow chart of a process of fabricating a YBAR sensor.

FIG. 6 is a simplified flow chart of a method 600 for making a YBAR sensor such as the YBAR sensor 100 of FIG. 1. The method 600 starts at 610 with a piezoelectric plate disposed on a sacrificial substrate 602 and a device substrate 604. The method 600 ends at 695 with a completed YBAR or filter. The flow chart of FIG. 6 includes only major process steps. Various conventional process steps (e.g. surface preparation, cleaning, inspection, baking, annealing, monitoring, testing, etc.) may be performed before, between, after, and during the steps shown in FIG. 6.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1200 nm. When the substrate is silicon, a layer of $SiO_2$ may be disposed between the piezoelectric plate and the substrate. The piezoelectric plate 602 may be, for example, y-cut or rotated y-cut lithium niobate with a thickness of 300 nm to 1000 nm bonded to a silicon wafer with an intervening $SiO_2$ layer. The device substrate 604 may be silicon, fused silica, quartz, or some other material.

At 620, the piezoelectric plate on the sacrificial substrate 602 and the device substrate 604 are bonded. The piezoelectric plate on the sacrificial substrate 602 and the device substrate 604 may be bonded using a wafer bonding process such as direct bonding, surface-activated or plasma-activated bonding, electrostatic bonding, or some other bonding technique.

After the piezoelectric plate on the sacrificial substrate 602 and the device substrate 604 are bonded, the sacrificial substrate, and any intervening layers, are removed at 630 to expose the surface of the piezoelectric plate (the surface that previously faced the sacrificial substrate). The sacrificial substrate may be removed, for example, by material-dependent wet or dry etching or some other process.

A front-side conductor pattern, such as front-side conductor patterns 130, 132 of FIG. 1, is formed at 640 by depositing and patterning one or more conductor layers on the surface of the piezoelectric plate that was exposed when the sacrificial substrate was removed at 630. The conductor pattern may be, for example, aluminum, an aluminum alloy, copper, molybdenum a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the front-side conductor patterns, such as the busbars of the IFPs.

The front-side conductor pattern may be formed at 640 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Further, portions of the piezoelectric plate between the conductors of the front-side conductor pattern can be removed to form grooves in the piezoelectric plate between the conductors. For example, the portions can be removed during the same or a different etching process. The portions may be removed through an entire thickness of the piezoelectric plate or only to a certain depth.

Alternatively, the front-side conductor pattern may be formed at 640 using a lift-off process. Photoresist may be deposited over the piezoelectric plate. and patterned to define the front-side conductor pattern. The conductor layer and, optionally, one or more other layers may be deposited in sequence over the surface of the piezoelectric plate. The photoresist may then be removed, which removes the excess material, leaving the conductor pattern.

At 650, a cavity is formed in the back side of the piezoelectric plate, opposite the position of the front-side conductor pattern. The cavity may be formed using an anisotropic or orientation-dependent dry or wet etch to open a hole through the substrate to the back side piezoelectric plate.

At 660, a back-side conductor pattern is formed on the back side of the piezoelectric plate. The back-side conductor pattern can be formed to be like back-side conductor pattern 134 of FIG. 1. The back-side conductor pattern can be formed by depositing and patterning one or more conductor layers on the back surface of the piezoelectric plate through the cavity formed at 650. The back-side conductor pattern may be, for example, aluminum, an aluminum alloy, copper, molybdenum a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate.

After the back-side conductor pattern is formed at 660, a sensing layer, such as the sensing layer 140 of FIG. 1, may be formed over all or a portion of the back-side conductor pattern.

The sensor device may then be completed at 680. Actions that may occur at 680 include depositing an encapsulation/passivation layer such as $SiO_2$ or $Si_3O_4$ over all or a portion of the front side of the device; forming bonding pads or solder bumps or other means for making connection between the device and external circuitry; excising individual devices from a wafer containing multiple devices; other packaging steps; and testing. After the sensor device is completed, the process ends at 695.

A variation of the process 600 starts with a single-crystal piezoelectric wafer at 602 instead of a thin piezoelectric plate on a sacrificial substrate of a different material. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is the sacrificial substrate. At 630, the piezoelectric wafer may be split at the plane of the implanted ions (for example, using thermal shock), leaving a thin plate of piezoelectric material exposed and bonded to the back-side conductor pattern. The thickness of the thin plate piezoelectric material is determined by the energy (and thus depth) of the implanted ions. The process of ion implantation and subsequent separation of a thin plate is commonly referred to as "ion slicing".

Other variations of the process 600 include forming the back-side conductor patterns and optionally the sensing layer on the piezoelectric plate and/or forming the cavity in the device substrate prior to assembling the piezoelectric plate and device substrate at 620.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic sensor device comprising:
 a piezoelectric plate having a front surface and a back surface opposite the front surface;
 an electrically floating back-side conductor pattern formed on the back surface;
 first and second front-side conductor patterns formed on the front surface opposite the back-side conductor pattern; and
 a sensing layer formed over at least a portion of the floating back-side conductor pattern, wherein the sensing layer is configured to capture a biological or chemical target species, and
 wherein the piezoelectric plate is configured such that an RF signal applied between the first and second conductor patterns excites shear bulk acoustic waves in the piezoelectric plate.

2. The device of claim 1, wherein the piezoelectric plate is one of lithium niobate and lithium tantalate.

3. The device of claim 2, wherein the piezoelectric plate is one of Y-cut and rotated Y-cut.

4. The device of claim 1, wherein the sensing layer is one of an antigen, an antibody, an enzyme, a nucleic acid, a DNA molecule, a polymer, an organic material with a particular functional group, or an inorganic layer.

5. The device of claim 1, wherein a resonance frequency of the device depends, in part, on an amount of the target species captured by the sensing layer.

6. The device of claim 1, wherein the sensing layer is one of an antigen, an antibody, an enzyme, a nucleic acid, a DNA molecule, an organic material with a selected functional group, and an inorganic layer.

7. The device of claim 1, further comprising a substrate, wherein a portion of the piezoelectric plate forms a diaphragm spanning a cavity in the substrate, and
 at least portions of the first and second front-side conductor pattern, the back-side conductor pattern, and the sensing layer are on the diaphragm.

8. The device of claim 7, wherein the diaphragm forms a seal across the cavity such that the first and second front-side conductor patterns are not exposed to the environment around the sensing layer.

9. The device of claim 1, wherein the first and second front-side conductor patterns comprise interleaved fingers connected to respective first and second busbars.

10. The device of claim 1, wherein an equal number of fingers is connected to each of the first and second busbars.

11. The device of claim 1, wherein a portion of the piezoelectric plate between the first and second front-side conductor patterns is recessed.

12. The device of claim 1, wherein at least one of the first front-side conductor pattern, the second front-side conductor pattern, and the floating back-side conductor pattern has a non-rectangular shape.

13. A sensor system comprising:
 an acoustic sensor device comprising:
  a piezoelectric plate having a front surface and a back surface opposite the front surface;
  an electrically floating back-side conductor pattern formed on the back surface;
  first and second front-side conductor patterns formed on the front surface opposite the back-side conductor pattern; and
  a sensing layer formed over at least a portion of the floating back-side conductor pattern,
 a measurement system to determine a presence of a target species in an environment based on a resonant frequency of the acoustic sensor device; and
 means for presenting the environment to the sensing layer of the acoustic sensor device.

14. The sensor system of claim 13, wherein the measurement system comprises:
 a reference frequency generator to provide a reference frequency; and
 a frequency comparator to compare the resonance frequency of the acoustic sensor device and the reference frequency.

15. The sensor system of claim 14, wherein the reference frequency generator includes a reference acoustic resonator.

16. The device of claim 13, wherein the sensing layer is configured to capture a target species from a liquid or gaseous environment.

17. The device of claim 13, wherein the sensing layer is configured to capture a biological or chemical target species.

18. The device of claim 13, wherein the sensing layer is one of an antigen, an antibody, an enzyme, a nucleic acid, a DNA molecule, a polymer, an organic material with a particular functional group, or an inorganic layer.

19. The device of claim 13, wherein the sensing layer is one of, a film, a monolayer, or a surface treatment.

20. An acoustic sensor device comprising:
 a piezoelectric plate having a front surface and a back surface opposite the front surface;
 an electrically floating back-side conductor pattern formed on the back surface;
 an interleaved finger pattern (IFP) formed on the front surface opposite the back-side conductor pattern; and
 a sensing layer formed over at least a portion of the floating back-side conductor pattern, wherein the sensing layer is configured to capture one of: a) a biological or chemical target species, or b) a target species from a liquid or gaseous environment, and
 wherein the piezoelectric plate is configured such that an RF signal applied to the IFP excites shear bulk acoustic waves in the piezoelectric plate.

* * * * *